United States Patent [19]

Sugihara et al.

[11] 4,396,829
[45] Aug. 2, 1983

[54] LOGIC CIRCUIT

[75] Inventors: Takanori Sugihara, Inagi; Makoto Yoshida, Kawasaki, both of Japan

[73] Assignee: Fujitsu Limited, Kanagawa, Japan

[21] Appl. No.: 204,928

[22] Filed: Nov. 7, 1980

[30] Foreign Application Priority Data

Nov. 9, 1979 [JP] Japan .................................. 54-45105

[51] Int. Cl.³ .................... H03K 21/36; H03K 23/00; H03K 19/00
[52] U.S. Cl. ...................................... 377/54; 377/37; 377/73; 377/81
[58] Field of Search ..................... 235/92 SH, 92 LG; 307/221 R; 328/37, 42

[56] References Cited

U.S. PATENT DOCUMENTS

| | | | |
|---|---|---|---|
| 3,146,345 | 8/1964 | Conover | 364/772 |
| 3,374,339 | 3/1968 | Webb | 235/92 SH |
| 3,906,195 | 9/1975 | Maejima | 235/92 SH |
| 3,978,413 | 8/1976 | Frohwerk | 307/221 R |

*Primary Examiner*—Howard Britton

*Attorney, Agent, or Firm*—Staas & Halsey

[57] ABSTRACT

A logical circuit which is capable of serving not only as a shift register but also as counter, comprises a cascade-connection of flip-flops of the same number as the number of bits required. The flip-flops have an input connected to a logical gate group composed of gates which are opened and closed by a shift signal and a count signal. The logical circuit does not require that a flip-flop be included for each shift register part and counter part for each bit, but only requires one flip-flop to perform both the count and shift function. The logical circuit is capable of performing an independent operation of a shift register, an independent operation of a counter and a compound operation of inputting data in a serial fashion for initialization and outputting counted data in a serial fashion. With the logical circuit of the present invention, the number of gates used is greatly reduced as compared with the prior art shift register/counter circuit; accordingly, the circuit of the present invention is of particular utility when formed as a large scale integrated circuit.

4 Claims, 11 Drawing Figures

LOGIC CIRCUIT

BACKGROUND OF THE INVENTION

1. Field of the Invention

The present invention relates to a logic circuit which is equipped with a shift function and a count function.

2. Description of the Prior Art

When inputting an initial value into a counter and then taking out the counted result after a predetermined number of count operating, the use of a small scale integrated circuit (SSI) or the like, in which the bits of data handled are input in parallel as the initial value to the counter and output in parallel as the counted value, does not pose any particular problems. In a large scale integrated circuit (LSI), however, such parallel input of the initial value into the counter from the outside and parallel output of the count value are difficult because of an increase in the number of bits of data handled and a limitation on the number of pins that can be used. Therefore, it is general practice in the prior art to supply the initial value data in serial form from the outside, convert the serial data, by a serial-parallel converting register, to parallel form for input to the counter and convert the count value of the counter in parallel form, by a parallel-serial converting register, to serial form for output.

FIG. 1 illustrates the arrangement of a conventional 4-bit counter/shift register employing a shift register and a counter. In FIG. 1, on the left-hand side of the broken line is a shift register part and on the right-hand side is a counter part. Reference numerals 1-1, 1-2, 1-3 and 1-4 indicate circuits for loading data in parallel; 2-1, 2-2, 2-3 and 2-4 designate cascade-connected flip-flops (FF), each of which is usually a delay (D) flip-flop or delay (D) latch; 3-1, 3-2, 3-3 and 3-4 identify gate circuits for loading data into the counter part and causing it to perform the count operation; 4-1, 4-2, 4-3 and 4-4 denote cascade-connected flip-flops (FF), each of which is usually a J-K flip-flop; and 5 indicates a carry output circuit.

The circuit of FIG. 1 perfroms in following manner. First, the initial value of each bit of the counter is entered in the shift register part. This is achieved by raising the level of a signal on a SHIFT LOAD terminal to a high level "H" in order to enter the initial value of the counter into the bit of each of the shift registers from a SERIAL DATA IN terminal. Needless to say, it is also possible, in this circuit, to set each bit of the counter to a low level "L" by a signal on a 7 COUNT terminal. Next, by raising the level of a signal at a COUNT LOAD terminal to the high level "H", the initial value is loaded into the counter part from the shift register part.

The counting operation is carried out in the following manner. First, the level of the signal at a COUNT LOAD terminal is lowered to the low level "L" and, at this time, a carry signal is applied to a CARRY IN terminal. When the signal at the CARRY IN terminal is at the high level, a carry exists and when the level of this signal is low, no carry exists.

Upon completion of the counting operation, the count result is loaded into the shift register part. This is performed by lowering the level of the signal at the SHIFT LOAD terminal to the low level L. Thereafter, data of each bit in the shift register part is outputted from a SERIAL OUT terminal.

FIG. 2 is a circuit diagram showing a specific example of the circuit arrangement of the counter/register depicted in FIG. 1. In FIG. 2, parts corresponding to those in FIG. 1 are identified by the same reference numerals and characters. The load circuits 1-1 to 1-4 are each constructed with three gates, and accordingly twelve gates are needed. The delay flip-flops 2-1 to 2-4 are each constructed with six gates; hence, 24 gates are required. The gates 3-1 to 3-4 are constructed with 19 gates in all. The J-K flip-flops 4-1 to 4-4 are each constructed with eight gates, and consequently 32 gates are required. Therefore, the counter/shift register of FIG. 1, except the carry output circuit and so forth, requires a total of about 87 gates.

As described above, the prior art circuit employs a register with the same number of bits as the counter for the serial-input, count and serial-output operations. Accordingly, for n-bit counting, the entire circuit arrangement including the register requires 2n flip-flops, along with a large number of gates. It is wasteful to include, for each bit, two flip-flops, one for register use and the other for counter use, and since the register and the counter do not overlap in their operational timing, it is possible to perform the both functions with one flip-flop per bit.

SUMMARY OF THE INVENTION

Accordingly, it is an object of the present invention to provide a logic circuit in which a counter is equipped with the function of a shift register or a shift register is equipped with a function of the counter, thereby overcoming the above-mentioned defect in the prior art.

Briefly stated, the logic circuit of the present invention comprises a plurality of cascade-connected flip-flops, each having connected to its input a logical gate group composed of gates which are opened and closed by a shift signal and a count signal. The logic circuit is constructed so that the flip-flop of each bit serves as a shift register or counter in response to the above-mentioned signals.

DESCRIPTION OF THE PREFERRED EMBODIMENTS

Figure 3:
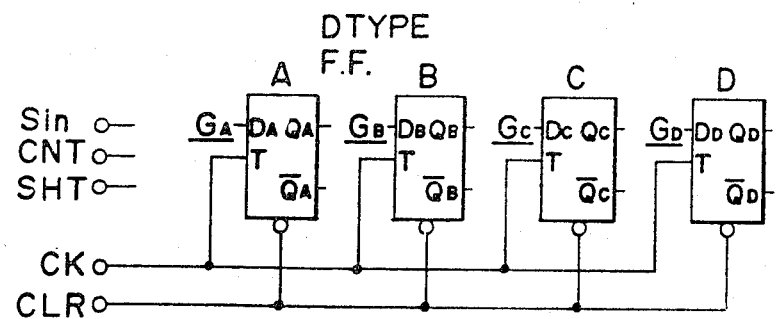
FIG. 3 is a block diagram showing the construction of a 4-bit delay flip-flop.

In FIG. 3 there is illustrated the construction of a circuit (hereinafter referred to simply as a counter) which comprises four stages of flip-flops A to D and functions as both a shift register and a counter, and in which the flip-flops A to D are driven by a common clock signal CK and reset (cleared) by a common clear signal CLR. Connected to the input stages of the flip-flops A to D there are respectively included logical gates $G_A$ to $G_D$ shown in FIGS. 4 to 7. In FIG. 3, reference character Sin indicates shift data (an initial value to be preset in the counter) which are inputted into the counter in a serial fashion; SHT designates a shift mode signal which signifies a shift operation when it is at the high level "H"; and CNT identifies a count mode signal, which signifies a count operation when it is at the high level "H". The shift mode signal SHT and the count mode signal CNT bear the following relationship:

$$SHT = \overline{CNT} \qquad (1)$$

The logical gate $G_A$ of a first bit A is set to fulfil the following conditions. During the shift, since the shift data Sin are inputted, the data input $D_A$ input into the flip-flop A is as follows:

$$D_A = SHT \cdot Sin \qquad (2)$$

The expression (2) means that when logical gate $G_A$ is in the shift mode, the data input $D_A$ is the shift data Sin. During counting the element of the first bit is required only to perform a toggle operation, so that the data input $D_A$ to the flip-flop A is as follows:

$$D_A = CNT \cdot \overline{Q_A} \qquad (3)$$

The expression (3) means that when the logical gate $G_A$ is in the count mode, the data input $D_A$ is $\overline{Q_A}$, which is the Q output from the flip-flop A and the inverted output or output of the Q output $Q_A$ from the flip-flop A. This applies to the other bit outputs of the flip-flops B, C and D, that is, each have a Q and $\overline{Q}$ output. Accordingly, in order for the logical gate $G_A$ to be equipped for both the count and the shift function, it suffices, from the expressions (2) and (3), that the data input $D_A$ is as follows:

$$D_A = (SHT \cdot Sin + CNT \cdot \overline{Q_A}) \qquad (4)$$

Figure 4:
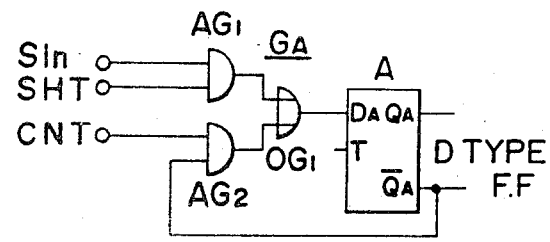
FIG. 4 is a circuit diagram illustrating the construction for a logical gate of a first bit.

FIG. 4 shows an embodiment of the expression (4). In FIG. 4, an AND gate $AG_1$ corresponds to the expression (2), an AND gate $AG_2$ corresponds to the expression (3) and an OR gate $OG_1$ embodies the expression (4).

In the logical gate $G_B$ of a second bit B, during shifting, the output $Q_A$ of the preceding stage is applied to an input $D_B$, the data input $D_B$ to the flip-flop B is as follows:

$$D_B = SHT \cdot Q_A \qquad (5)$$

During counting, when $Q_A = 1$ (in the case of a carry from the first bit A), since the logical gate GB is required only to perform the toggle operation, the data input DB is as follows:

$$D_B = \overline{Q_B} \qquad (6)$$

During counting, when $Q_A = 0$ (in the case of no carry from the first bit A), it is necessary that the status be invariable, and in this case, the data input $D_B$ is as follows:

$$D_B = Q_B \qquad (7)$$

Combining the expressions (6) and (7), it folows that $$D_B = CNT \ (Q_A \cdot \overline{Q_B} + \overline{Q_A} \cdot Q_B) \qquad (8)$$

Accordingly, in order that the logical gate GB may be equipped with the shift and the count function, the data input $D_B$ which results from combining the expressions (5) and (8), is as follows:

$$D_B = SHT \cdot Q_A + CNT(Q_A \cdot \overline{Q_B} + \overline{Q_A} \cdot Q_B) \qquad (9)$$

Using the expression (1), the expression (9) is simplified as follows:

$$D_B = SHT \cdot Q_A + CNT(Q_A \cdot \overline{Q_B} + \overline{Q_A} \cdot Q_B) \qquad (10)$$

$$= SHT \cdot Q_A + \overline{SHT} \cdot Q_A \cdot \overline{Q_B} + CNT \cdot \overline{Q_A} \cdot Q_B$$

$$= (SHT \cdot Q_A) + (Q_A \cdot \overline{Q_B}) + (CNT \cdot \overline{Q_A} \cdot Q_B)$$

Figure 5:
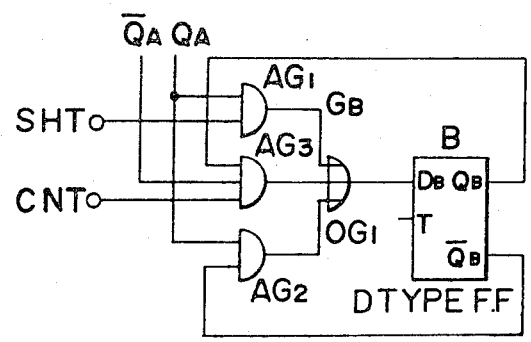
FIG. 5 is a circuit diagram illustrating the construction for a logical gate of a second bit.

FIG. 5 shows an embodiment of the expression (10). In FIG. 5, AND gates $AG_1$, $AG_2$ and $AG_3$ respectively correspond to the right hand first, second and third terms of the expression (10), and an OR gate $OG_1$ generates the logical sum of the first to third terms of, and thus complets execution of, the expression (10).

Also with respect to third and fourth bits C and D, their logical gates are similarly constructed, with only the number of carry conditions increasing. A logical gate $G_C$ of the third bit C is set so that data input $D_C$ to the flip-flop C satisfies the following condition:

$$D_C = SHT \cdot Q_B + CNT(Q_A \cdot Q_B)\overline{Q_C} + (\overline{Q_A \cdot Q_B})Q_C) \qquad (11)$$

$$= (SHT \cdot Q_B) + (Q_A \cdot Q_B \cdot \overline{Q_C}) + (CNT(\overline{Q_A} + \overline{Q_B})Q_C)$$

Figure 6:
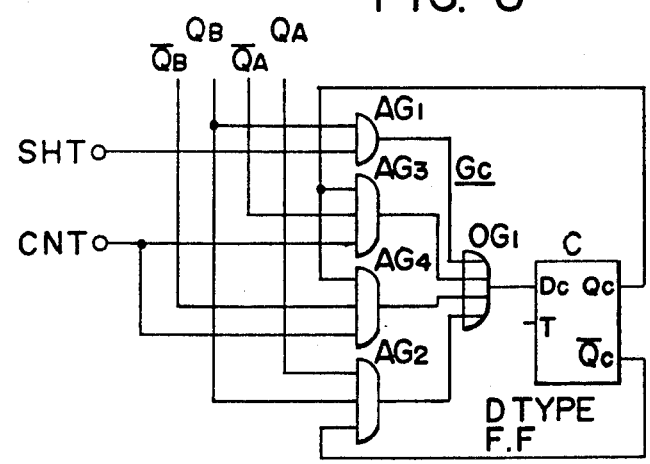
FIG. 6 is a circuit diagram illustrating the construction for a logical gate of a third bit.

FIG. 6 is an embodiment of the expression (11). In FIG. 6, AND gates $AG_1$ and $AG_4$ respectively correspond to the right hand first to fourth terms, where the (third term equals $CNT \cdot \overline{Q_A} \cdot Q_C$, and the fourth term equals $CNT \cdot \overline{Q_B} \cdot Q_C$ of the expression (11), and an OR gate $OG_1$ generates the logical sum of the first to fourth terms and thus completes the execution of the expression (11). Likewise, a logical gate $G_D$ of the fourth bit D is constructed so that data input $D_D$ to the flip-flop D satisfies the following condition:

$$D_D = SHT \cdot Q_C + CNT(Q_A \cdot Q_B \cdot Q_C)\overline{Q_D} + (\overline{Q_A \cdot Q_B \cdot Q_C})Q_D) \qquad (12)$$

$$= (SHT \cdot Q_C) + (Q_A \cdot Q_B \cdot Q_C \cdot \overline{Q_D}) +$$

$$(CNT(\overline{Q_A} + \overline{Q_B} + \overline{Q_C})Q_D)$$

Figure 7:
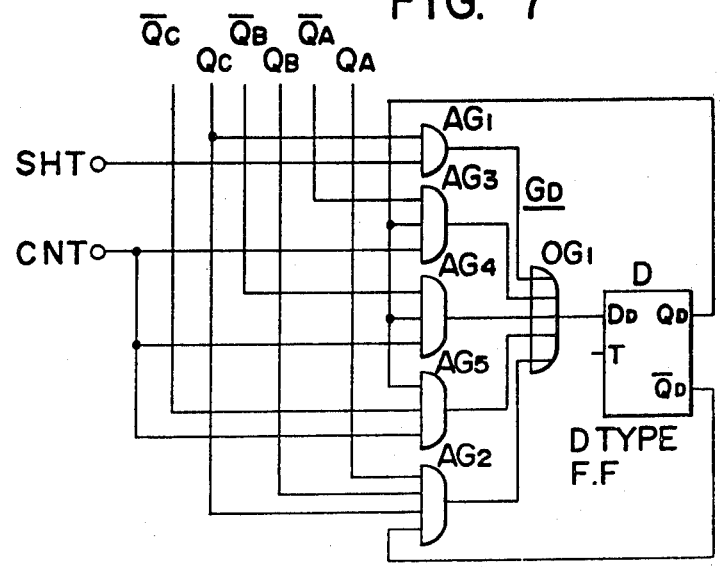
FIG. 7 is a circuit diagram illustrating the construction for a logical gate of a fourth bit.

FIG. 7 shows an embodiment of the expression (12). In FIG. 7, AND gates $AG_1$ and $AG_5$ correspond to the right hand first to fifth terms of the expression (12) and an OR gate $OG_1$ generates the logical sum of the first to fifth terms and thus completes the execution of the expression (12).

Figure 8:
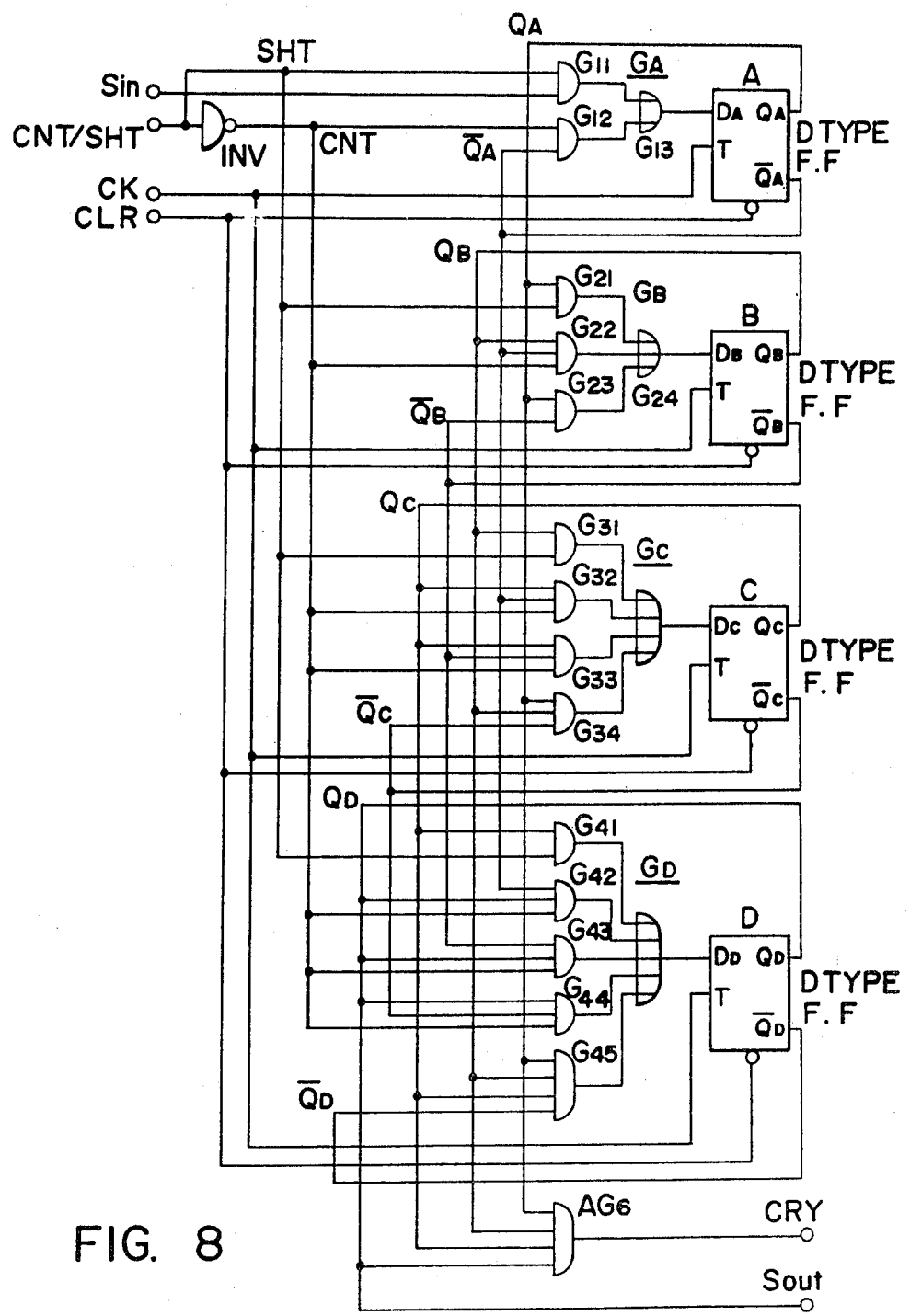
FIG. 8 is a circuit diagram showing the arrangement of a 4-bit counter/shift register including the logical gates shown in FIGS. 4 to 7.

FIG. 8 illustrates a 4-bit counter/shift register in which the logical gates shown in FIGS. 4 to 7 are connected in the bit arrangement of FIG. 3. Since the signals shift SHT and count CNT bear the relationship that SHT=$\overline{\text{CNT}}$, the signal CNT/SHT which is at the high-level in the shift mode is applied to an inverter INV; in this case, the shift signal SHT is used as the input to the inverter INV and the count signal CNT is used as the of the inverter INV. When the shift signal SHT is at the high-level, gates $G_{11}$, $G_{21}$ and $G_{31}$ and $G_{41}$ are opened and the serial data Sin inputted in synchronism with the clock CK are applied via the AND gate $G_{11}$ and an OR gate $G_{13}$ to the input terminal $D_A$ of the flip-flop A and read out in sequential order. The output $Q_A$ from the flip-flop A is applied via the AND gate $G_{21}$ and an OR gate $G_{24}$ to the input terminal $D_B$ of the flip-flop B and read therein by the clock input. Also in the flip-flops C and D, the same operations as mentioned above are performed. Accordingly, when inputting the serial data Sin of, for example, four bits, the bits are stored in the flip-flops D, C, B and A. In this way, the counter is initialized. Next, when the count shift signal CNT/SHT is at the low-level, the signal shift SHT is at the low-level and the count signal CNT is at the high-level, the aforesaid gates $G_{11}$, $G_{21}$, $G_{31}$ and $G_{41}$ are closed while the AND gates $G_{12}$, $G_{22}$, $G_{32}$, $G_{33}$, $G_{42}$, $G_{43}$ and $G_{44}$ are opened. In the input gate groups of the flip-flops A to D of the first to fourth stages, the arithmetic operations of the right hand second term of the expression (4) and the right hand second and third terms of the expressions (10), (11) and (12) are carried out; namely, a count-up operation takes place. Next, when the count shift signal CNT/SHT is at the high-level again, the next serial data Sin are sequentially entired into the flip-flops A to D. In the absence of the next data, the data Sin is made a continuation of 1 or 0. When the count shift signal CNT/SHT is at the high level the count results are sequentially outputted from a terminal Sout. An AND gate $AG_6$ obtains the logical product of Q outputs from the respective flip-flops in order to yield a carry output CRY for the first to fourth bits. The carry output CRY is used when connecting a number of counter stages.

Figure 1:
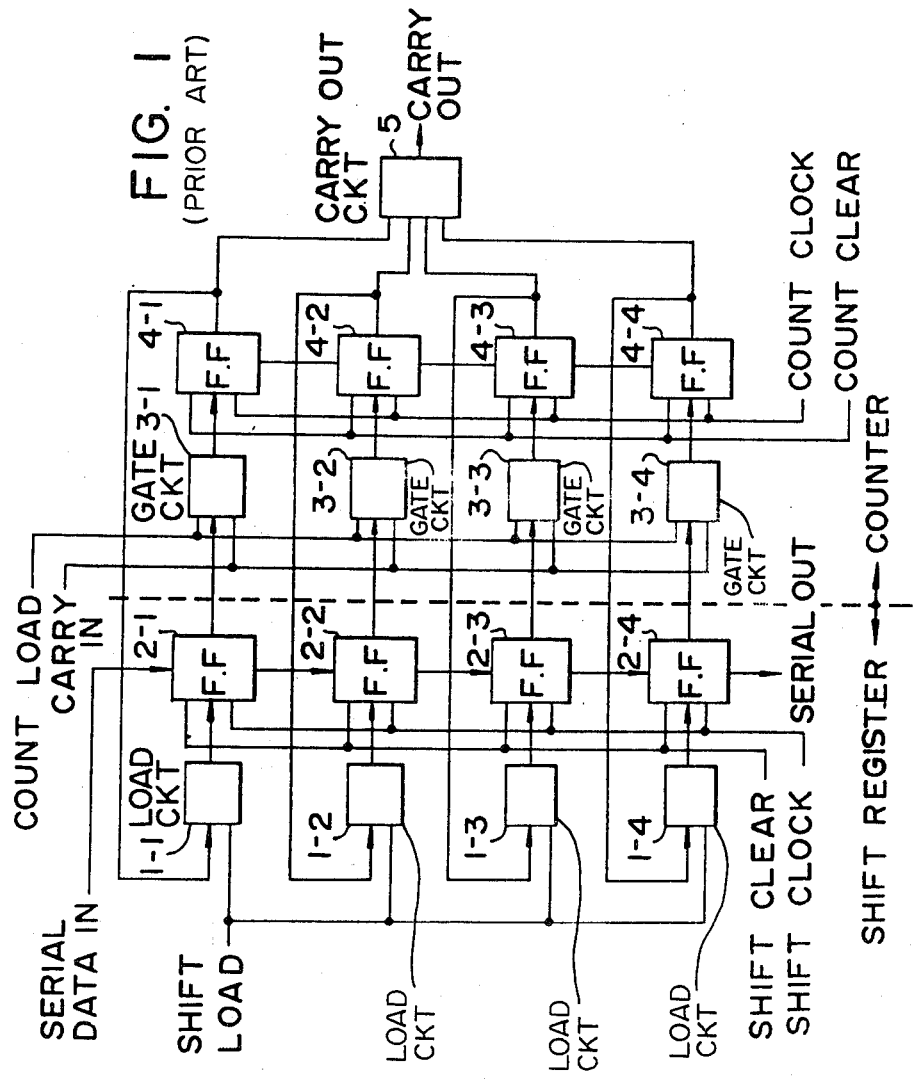
FIG. 1 is a block diagram showing the construction of a conventional counter/shift register employing a shift register and a counter.
Figure 2:
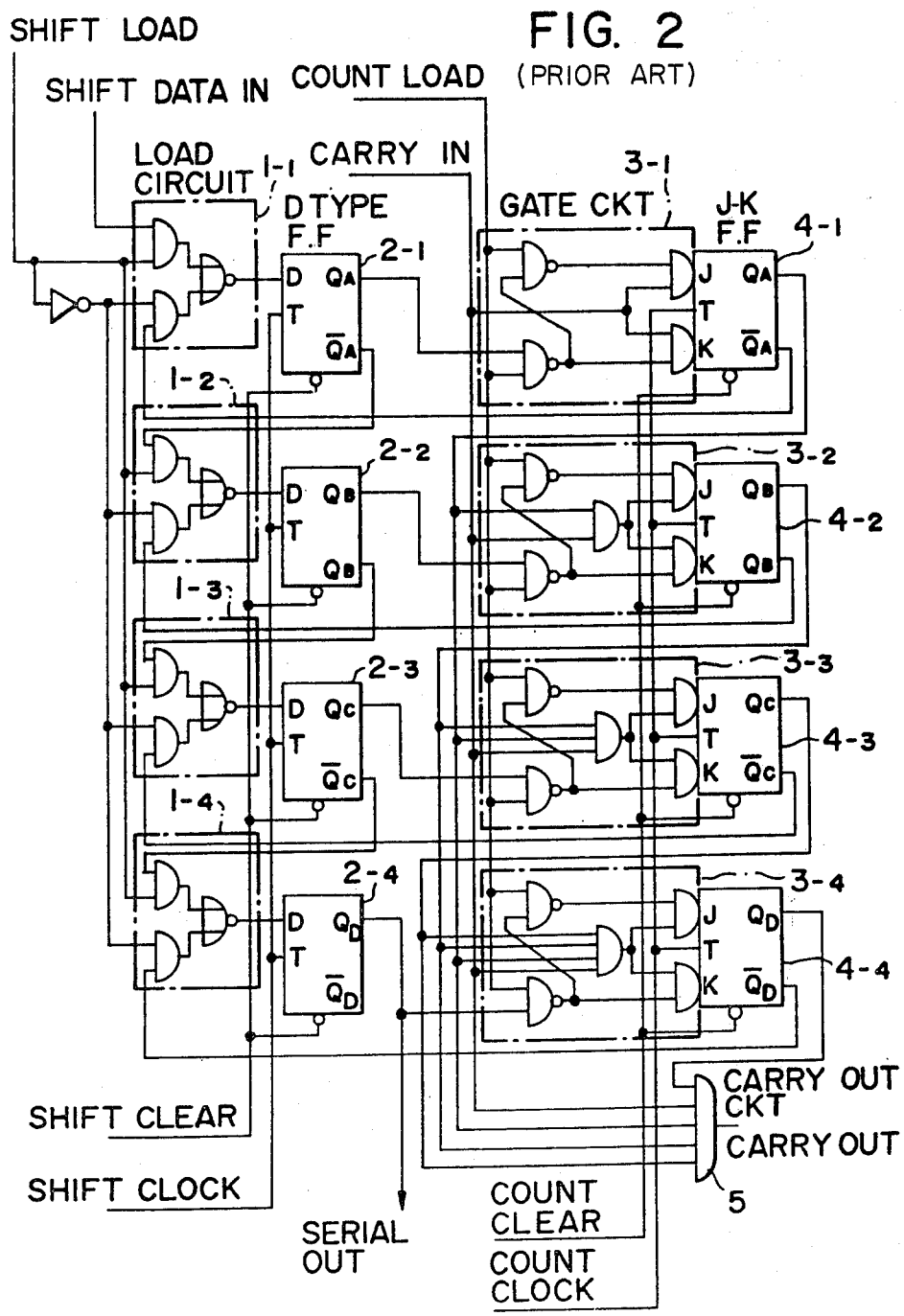
FIG. 2 is a circuit diagram illustrating a specific example of the basic circuit arrangement of the counter/shift register shown in FIG. 1.

In the circuit of FIG. 8, since the delay flip-flops A to D are each constructed with by six gates, the number of gates required in this part is 24, and since about 20 gates are needed in the other parts, approximately 44 gates in all are required. Accordingly, the number of gates used in the circuit of the present invention is about ½ that needed in the prior art circuit arrangement of FIG. 2.

Figure 9:
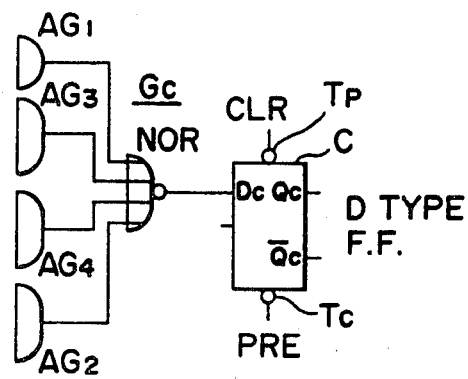
FIGS. 9 and 10 are circuit diagrams illustrating a logical gate with a construction different from those in FIGS. 4 to 7.
Figure 10:
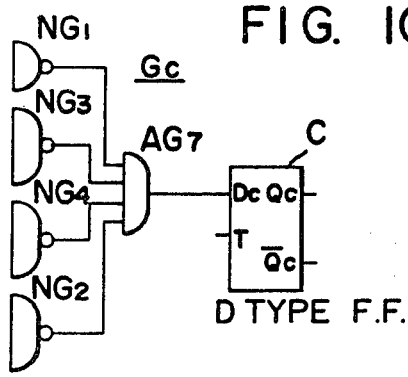

FIGS. 9 and 10 show modified forms of the logical gate $G_C$ and a similar construction also applies to the other logical gates. In FIG. 9, a NOR gate is substituted for the OR gate $OG_1$ in FIG. 6. With this arrangement, the output from the NOR gate NOR is reversed in level from the output from the OR gate $OG_1$, therefore it is necessary to handle the data input $\underline{D}_C$ as $\overline{D}_C$, by reversing the outputs $Q_C$ and $\overline{Q}_C$ ($Q_C \rightarrow \overline{Q}_C$, $\overline{Q}_C \rightarrow Q_C$), apply the clear signal CLR to a preset terminal Tp and, conversely, apply a preset signal PRE to a clear terminal Tc. In FIG. 10, the AND gates $AG_1$ to $AG_4$ in FIG. 6 are replaced by NAND gates $NG_1$ to $NG_4$ and the OR gate $OG_1$ in FIG. 6 is replaced by an AND gate $AG_7$. In this case, the output from the AND gate $AG_7$ is reversed in level from the output from the OR gate $OG_1$, and accordingly the same output reversal operations as those in FIG. 9 are performed.

Figure 11:
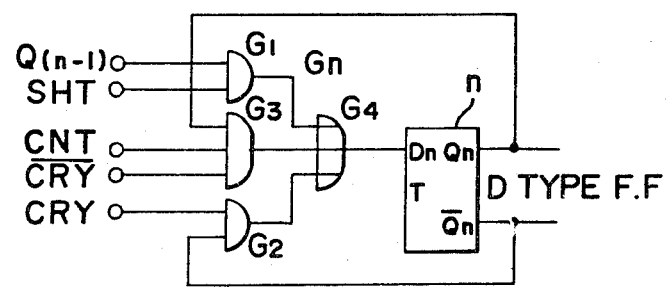
FIG. 11 is a circuit diagram showing the construction of a logical gate generalized.

A counter/shift register of more than four bits can be formed by using a plurality of such 4-bit counter/shift registers and the number contained in bits of one counter shift register can also be changed. A counter/shift register with an arbitrary number of bits can be constructed as follows. A logical gate $G_n$ of an nth bit is formed as shown in FIG. 11 since the data input $D_n$ is such as given by the following expression:

$$D_n = (\text{SHT} \cdot Q_{(n-1)}) + (\text{CRY} \cdot Q_n) + (\text{CNT} \cdot \overline{\text{CRY}} \cdot Q_n) \qquad (13)$$

where CRY=$Q_1 \cdot Q_2 \ldots Q_{(n-1)}$. The right hand first, second and third terms of the expression (13) can be embodied respectively by gates $G_1$ by substituting SHT, $G_2$ and $G_3$ in FIG. 11 (CNT can be omitted, as mentioned previously) and their logical sum can be embodied by a gate $G_4$ in FIG. 11. The gates $G_1$ to $G_3$ are AND gates, each having the AND function, or NAND gates and the gate $G_4$ is an OR gate having the OR function or a NOR gate, as described previously. Generalizing the present invention as shown in FIG. 11, a counter/shift register of a desired number of bits can be created, however by connecting a plurality of stages of such circuits, it is possible to construct a counter/shift register in which the number of bits is an integral multiple of the number of stages. Further, the flip-flops used need not always be D flip-flops but may also be J-K flip-flops.

The logical circuit of the present invention described above has the count function and the shift function, and hence is a general purpose circuit. That is, the logical circuit of the present invention is capable of performing an independent operation of a counter, an independent operation of a shift register and a compound operation comprised of serial inputting of data and serial outputting of data after counting. In addition, the logical circuit can be constructed with the desired number of bits and the number of flip-flops is limited to that required for constructing the counter and, further, the number of gates used is smaller than that in the case of constructing the counter and the register separately. Accordingly, the present invention is of particular utility when applied to the master slice system large scale integration LSI which is limited in the available number of gates.

It will be apparent that many modifications and variations may be effected without departing from the scope of the novel concepts of this invention.

What is claimed is:

1. A logical circuit, operatively connectable to receive a shift signal and a count signal, comprising:
    a plurality of cascade-connected flip-flops, each having an input; and
    logical gate groups, each having an output operatively connected to the input of the respective flip-flop, including gates to be opened and closed by the shift signal and the count signal so that the respective flip-flop serves as a shift register or a counter in response to the shift signal and the count signal;
    said logical circuit operatively connectable to receive serial input data Sin, and the nth logical gate group, operatively connected to the input of the nth (n=1, 2, 3, ... ) flip-flop, have the construction represented by the following expression:

$$D_N = (\text{SHT} \cdot Q_{(n-1)}) + (\text{CRY} \cdot Q_n) + (\text{CNT} \cdot \overline{\text{CRY}} \cdot Q_n)$$

where $D_n$ is the input to the nth flip-flop and the output from the nth logical gate group, SHT is the shift signal, CNT is the count signal and bears a relationship to the shift signal SHT of CNT=$\overline{\text{SHT}}$, $Q_n$ is the Q output of the nth flip-flop $Q_n$ is the Q output of the nth flip-flop, $\overline{Q_{(n-1)}}$ is the $\overline{Q}$ output of the (n−1)th flip-flop for n greater than 1, Q(n−1) is serial input data Sin when n=1, and CRY=$Q_1 \cdot Q_2 \cdot Q_3 \ldots \cdot Q_{(n-1)}$.

2. A logical circuit, operatively connectable to receive serial input data and count data, comprising m shift counter means, where m is an integer greater than or equal to 3, including:
   means for receiving serial input data as initialization data;
   means for receiving count data and counting the count data; and
   means for transmitting serial output data which represents the initialization data as increased by the count data;
   each of said m shift counter means having an input and an output, the input of the first shift counter means operatively connectable to receive the serial input data and the count data, the output of the first shift counter means operatively connected to the input of the second shift counter means, the output of the (m−1)th shift counter means operatively connected to the input of the mth shift counter means, so that the output of the mth shift counter mans is a serial output of said logical circuit;
   said logical circuit operatively connectable to receive a shift signal, a count signal, a carry signal and a carry bar signal and each of said m shift counter means comprising:
   a flip-flop, having an input, having a flip-flop output for outputting a flip-flop output signal, and having a bar output for outputting a flip-flop bar output signal, wherein the flip-flop output is the output of said shift counter means;
   a first AND gate having a first input which is the input of said shift counter means and having a second input operatively connectable to receive the shift signal;
   a second AND gate having a first input, operatively connected to said flip-flop, for receiving the flip-flop output signal, having a second input operatively connectable to receive the carry bar signal;
   a third AND gate having a first input operatively connectable to receive the carry signal and having a second input operatively connected to said flip-flop, for receiving the flip-flop bar output signal; and
   an OR gate having a first input operatively connected to the output of said first AND gate, having a second input operatively connected to the output of said second AND gate, having a third input operatively connected to the output of said third AND gate, and having an output operatively connected to the input of said flip-flop.

3. A logical circuit according to claim 2, further comprising:
   a multiple input AND gate, having P inputs, where P is an integer greater than or equal to 2 and less than or equal to m, having a first input operatively connected to the output of said first shift counter means, and having the Pth input operatively connected to the output of the Pth shift counter means, so that the carry signal is generated by said multiple input AND gate.

4. A logical circuit according to claim 2, wherein the shift signal is the logical inverse of the count signal.

* * * * *

UNITED STATES PATENT AND TRADEMARK OFFICE
CERTIFICATE OF CORRECTION

PATENT NO. : 4,396,829                Page 1 of 3

DATED : August 2, 1983

INVENTOR(S) : Takanori Sugihara et al

It is certified that error appears in the above-identified patent and that said Letters Patent is hereby corrected as shown below:

Front page, [73], Assignee: "Kanagawa" should be --Kawasaki--;

[30] "54-45105" should be --54-145105--.

Column 1, line 11, "operating" should be --operations--;

line 43, "perfroms" should be --performs--;

line 51, "7 COUNT" should be --COUNT CLEAR--;

line 66, "L" should be --"L"--.

Column 2, line 32, "the" should be --a--;

line 54, "for" should be --of--, line 56, "for" should be --of--, line 58, "for" should be --of--, line 60, "for" should be --of--, Column 3, line 18, "a" should be --the--;

line 24, "fulfil" should be --fulfill--;

line 40, "Q" should be --$\overline{Q}$--;

UNITED STATES PATENT AND TRADEMARK OFFICE
CERTIFICATE OF CORRECTION

PATENT NO. : 4,396,829   Page 2 of 3

DATED : August 2, 1983

INVENTOR(S) : Takanori Sugihara et al

It is certified that error appears in the above-identified patent and that said Letters Patent is hereby corrected as shown below:

line 41, delete "or output", and after "output", second occurrence, insert --or output--.

Column 4, line 7, "$D_B = \bar{Q}_B$" should be --$D_B = Q_B$--;

line 9, "folows" should be --follows--;

line 34, "complets" should be --completes--;

line 49, delete ",";

line 50, after "$Q_C$", insert --,--.

Column 5, line 8, after "the", second occurrence, insert --output--;

line 34, "entired" should be --entered--;

line 56, "$\overline{DC}$," should be --$\overline{D_C}'$,--.

Column 6, line 1, after "number", insert --of bits--; delete "bits of one";

line 2, "counter shift" should be --counter/shift--;

line 8, "$Q_n t$" should be --$\bar{Q}_n^+$--;

line 12, delete "by substituting SHT";

UNITED STATES PATENT AND TRADEMARK OFFICE
CERTIFICATE OF CORRECTION

PATENT NO. : 4,396,829

DATED : August 2, 1983

INVENTOR(S) : Takanori Sugihara et al

Page 3 of 3

It is certified that error appears in the above-identified patent and that said Letters Patent is hereby corrected as shown below:

line 13, after "omitted", insert --by substituting SHT--;

line 38, delete "that";

change lines 65-68 to read as follows:
--where $D_n$ is the input to the nth flip-flop and the output from the nth logical gate group, SHT is the shift signal, CNT is the count signal and bears a relationship to the shift signal CNT=SHT, $Q_n$ is the Q output of--.

Column 7, line 27, "mans" should be -- means--.

Signed and Sealed this

Nineteenth Day of June 1984

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO. : 4,396,829
DATED : August 2, 1983
INVENTOR(S) : TAKANORI SUGIHARA ET AL It is certified that error appears in the above-identified patent and that said Letters Patent is hereby corrected as shown below:

Col. 7, line 1, "$Q_n$" should be --$\overline{Q}_n$--;

"Q output" should be --$\overline{Q}$ output--;

line 2, "$\overline{Q}_{(n-1)}$" should be --$Q_{(n-1)}$--;

"$\overline{Q}$ output" should be --Q output--;

line 3, "Q(n-1) should be --$Q_{(n-1)}$--.

Signed and Sealed this

Nineteenth Day of February 1985

[SEAL]

Attest:

DONALD J. QUIGG

Attesting Officer     Acting Commissioner of Patents and Trademarks